US012073166B2

(12) United States Patent
Chang et al.

(10) Patent No.: US 12,073,166 B2
(45) Date of Patent: Aug. 27, 2024

(54) METHOD AND STRUCTURE FOR MANDREL PATTERNING

(71) Applicant: Taiwan Semiconductor Manufacturing Company, Ltd., Hsinchu (TW)

(72) Inventors: Yung Feng Chang, Hsinchu (TW); Pi-Yun Sun, Hsinchu (TW); Tung-Heng Hsieh, Hsinchu County (TW); Yu-Jung Chang, Hsinchu County (TW); Bao-Ru Young, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 352 days.

(21) Appl. No.: 17/566,472

(22) Filed: Dec. 30, 2021

(65) Prior Publication Data
US 2022/0414309 A1  Dec. 29, 2022

Related U.S. Application Data

(60) Provisional application No. 63/214,889, filed on Jun. 25, 2021.

(51) Int. Cl.
*G06F 30/392* (2020.01)
(52) U.S. Cl.
CPC ................ *G06F 30/392* (2020.01)

(58) Field of Classification Search
USPC ........................ 716/50, 51, 52, 53, 54, 55
See application file for complete search history.

(56) References Cited

U.S. PATENT DOCUMENTS

| | | | |
|---|---|---|---|
| 8,645,902 B1 * | 2/2014 | Yu | G06F 30/398 716/139 |
| 8,796,666 B1 | 8/2014 | Huang et al. | |
| 8,822,243 B2 | 9/2014 | Yan et al. | |
| 8,850,366 B2 | 9/2014 | Liu et al. | |
| 8,906,595 B2 | 12/2014 | Liu et al. | |
| 8,954,899 B2 | 2/2015 | Wu et al. | |
| 8,987,142 B2 | 3/2015 | Lee et al. | |
| 9,093,530 B2 | 4/2015 | Huang et al. | |
| 9,053,279 B2 | 6/2015 | Chang et al. | |
| 9,099,530 B2 | 8/2015 | Lin et al. | |
| 9,153,478 B2 | 10/2015 | Liu et al. | |
| 9,367,655 B2 | 6/2016 | Shih et al. | |
| 9,390,217 B2 | 7/2016 | Wang et al. | |
| 9,501,601 B2 | 11/2016 | Chang et al. | |
| 9,548,303 B2 | 1/2017 | Lee et al. | |

(Continued)

*Primary Examiner* — Brian Ngo
(74) *Attorney, Agent, or Firm* — Haynes and Boone, LLP

(57) ABSTRACT

A method that includes receiving an integrated circuit (IC) design layout including a layout block, where the layout block has a corner, adding first patterns along a first edge of the corner, adding second patterns along a second edge of the corner, moving a first column of the first patterns closest to the second edge horizontally toward the second edge, moving a second column of second patterns closest to the second edge horizontally toward the second edge, extending lengths of the first and second patterns in the first and second columns, and outputting a pattern layout in a computer-readable format, where the pattern layout includes the first patterns and the second patterns.

20 Claims, 13 Drawing Sheets

(56) References Cited

U.S. PATENT DOCUMENTS

| | | |
|---|---|---|
| 9,865,542 B2 | 1/2018 | Liaw et al. |
| 9,870,443 B2 | 1/2018 | Huang et al. |
| 9,876,114 B2 | 1/2018 | Huang |
| 2003/0162103 A1* | 8/2003 | Oshima .................... G03F 1/36 430/296 |
| 2010/0185996 A1* | 7/2010 | El Yahyaoui ......... G06F 30/398 716/139 |
| 2013/0179848 A1* | 7/2013 | Liu ....................... G06F 30/398 716/55 |
| 2013/0275927 A1* | 10/2013 | Su .......................... G06F 30/39 716/53 |
| 2017/0262571 A1* | 9/2017 | Cheng ...................... G03F 1/36 |

\* cited by examiner

METHOD AND STRUCTURE FOR MANDREL PATTERNING

PRIORITY

This application claims priority to U.S. Provisional Patent Application Ser. No. 63/214,889 filed on Jun. 25, 2021, the entire disclosure of which is incorporated herein by reference.

BACKGROUND

As integrated circuit (IC) technologies are continually progressing to smaller technology nodes, such as a 32 nm technology node and below, simply scaling down similar designs used at larger nodes often results in inaccurate or poorly shaped device features due to the resolution limit of conventional optical lithography technology. Examples of inaccurate or poorly shaped device features include rounding, pinching, necking, bridging, dishing, erosion, metal line thickness variations, and other characteristics that affect device performance.

Further, in a large-scale IC, multiple layout blocks (or active regions) may be used. A space (or inactive region) is provided between some layout blocks to accommodate printing inaccuracy such as line end rounding, as well as to meet certain spacing requirements for IC manufacturing. It is desirable to minimize such space.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
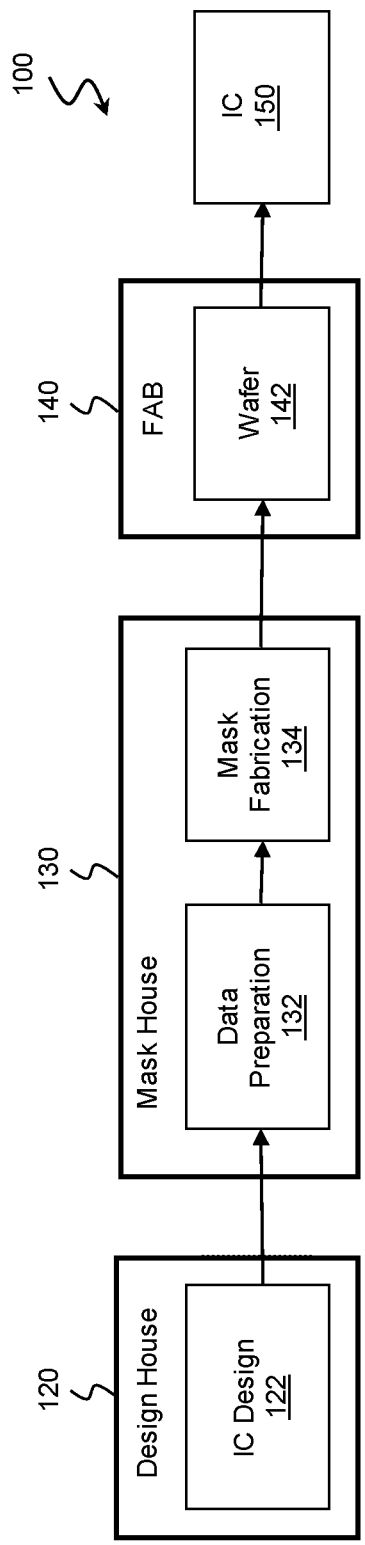
FIG. 1 is a simplified block diagram of an embodiment of an integrated circuit (IC) manufacturing system and an associated IC manufacturing flow.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a simplified block diagram of an embodiment of an IC manufacturing system 100 and an IC manufacturing flow associated therewith, which may benefit from various aspects of the provided subject matter. The IC manufacturing system 100 includes a plurality of entities, such as a design house 120, a mask house 130, and an IC manufacturer 140 (i.e., a fab), that interact with one another in the design, development, and manufacturing cycles and/or services related to manufacturing an IC 150. The plurality of entities is connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 140 may be owned by a single larger company, and may even coexist in a common facility and use common resources.

Figure 4:
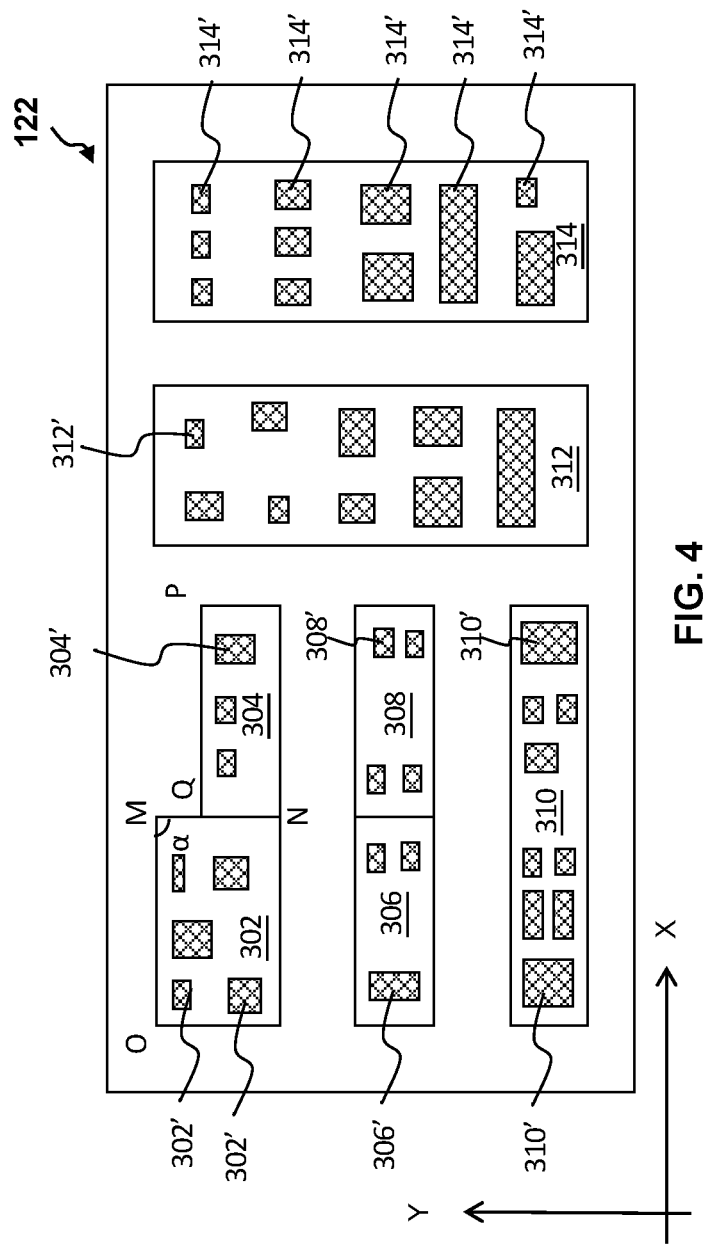
FIG. 4 illustrates an IC layout having multiple layout blocks according to various aspects of the present disclosure.

The design house (or design team) 120 generates an IC design layout 122. The IC design layout 122 includes various geometrical patterns designed for the IC 150. An example IC design layout 122 is shown in FIG. 4, which includes layout blocks 302, 304, 306, 308, 310, 312, and 314 of various shapes and sizes. In the present embodiments, the layout blocks 302, 304, 306, 308, 310, 312, and 314 are rectangles or squares distributed across the IC design layout 122 separated from or adjacent to each other.

The various geometrical device patterns in the IC design layout 122, such as the device patterns 302', 304', 306', 308', 310', 312', and 314', may correspond to patterns of metal, oxide, or semiconductor layers that make up various components of the IC 150 to be fabricated. The various components may include active regions, source and drain features, gate electrodes, metal lines or vias of an interlayer interconnection, and openings for bonding pads, which are to be formed in a semiconductor substrate (such as a silicon wafer) and various material layers disposed on the semiconductor substrate. In the present embodiment, the device patterns 302', 304', 306', 308', 310', 312', and 314' define a mandrel pattern that will be used for etching a substrate (with or without using spacers) to form fins for fin field effect transistors (FinFETs) or other types of multi-gate transistors such as gate-all-around transistors. In an embodiment, the device patterns 302', 304', 306', 308', 310', 312', and 314' are transferred to a mandrel structure used in a patterning process for IC 150 fabrication. In some embodiments, dummy patterns are added outside the layout blocks 302, 304, 306, 308, 310, 312, and 314 to improve pattern density, which will be described in more details later. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format, a DFII file format, or another suitable computer-readable data format.

The mask house 130 uses the IC design layout 122 to manufacture one or more masks to be used for fabricating various layers of the IC 150. The mask house 130 performs mask data preparation 132, mask fabrication 134, and other suitable tasks. The mask data preparation 132 translates the IC design layout 122 into a form that can be physically written by a mask writer. The mask fabrication 134 then fabricates a plurality of masks that are used for patterning a substrate (e.g., a wafer). In the present embodiment, the mask data preparation 132 and mask fabrication 134 are illustrated as separate elements. However, the mask data preparation 132 and mask fabrication 134 can be collectively referred to as mask data preparation.

In the present embodiment, the mask data preparation 132 prepares a pattern layout to be used in a patterning process. The preparation of the pattern layout includes inserting dummy patterns outside the layout blocks 302, 304, 306, 308, 310, 312, and 314 (e.g., in the operation 204); moving a portion of the dummy patterns (e.g., in the operation 206) closer to corners or edges of the layout blocks 302, 304, 306, 308, 310, 312, and 314, the moved portions of the dummy patterns are collectively referred as the third patterns; extending lengths of the third patterns (e.g., in the operation 208); connecting the dummy patterns in same lines. The pattern layout defines a mandrel pattern in a first exposure.

The mask data preparation 132 may further include other operations, such as extending the device patterns and creating cut patterns. The cut patterns may be used for cutting certain patterns during photolithography or removing certain features in an IC during fabrication.

The mask data preparation 132 may further include optical proximity correction (OPC) which uses lithography enhancement techniques to compensate for image errors, such as those that can arise from diffraction, interference, or other process effects. The mask data preparation 132 may further include a mask rule checker (MRC) that checks the IC design layout with a set of mask creation rules which may contain certain geometric and connectivity restrictions to ensure sufficient margins, to account for variability in semiconductor manufacturing processes, etc. The mask data preparation 132 may further include lithography process checking (LPC) that simulates processing that will be implemented by the IC manufacturer 140 to fabricate the IC 150. The processing parameters may include parameters associated with various processes of the IC manufacturing cycle, parameters associated with tools used for manufacturing the IC, and/or other aspects of the manufacturing process.

It should be understood that the above description of the mask data preparation 132 has been simplified for the purposes of clarity, and data preparation may include additional features such as a logic operation (LOP) to modify the IC design layout according to manufacturing rules. Additionally, the processes applied to the IC design layout 122 during mask data preparation 132 may be executed in a variety of different orders.

After mask data preparation 132 and during mask fabrication 134, a mask or a group of masks are fabricated based on the modified IC design layout. For example, an electron-beam (e-beam) or a mechanism of multiple e-beams is used to form a pattern on a mask (photomask or reticle) based on the modified IC design layout. The mask can be formed as a transmissive mask, a reflective mask, or other types of mask. In an embodiment, the mask is formed using binary technology, where a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM.

The IC manufacturer 140, such as a semiconductor foundry, uses the mask (or masks) fabricated by the mask house 130 to fabricate the IC 150. The IC manufacturer 140 is an IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a semiconductor wafer 142 is fabricated using the mask (or masks) to form the IC 150. The semiconductor wafer 142 includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects formed at various manufacturing steps. The mask may be used in a variety of processes. For example, the mask may be used in an ion implantation process to form various doped regions in the semiconductor wafer, in an etching process to form various etching regions in the semiconductor wafer, and/or other suitable processes.

Figure 2:
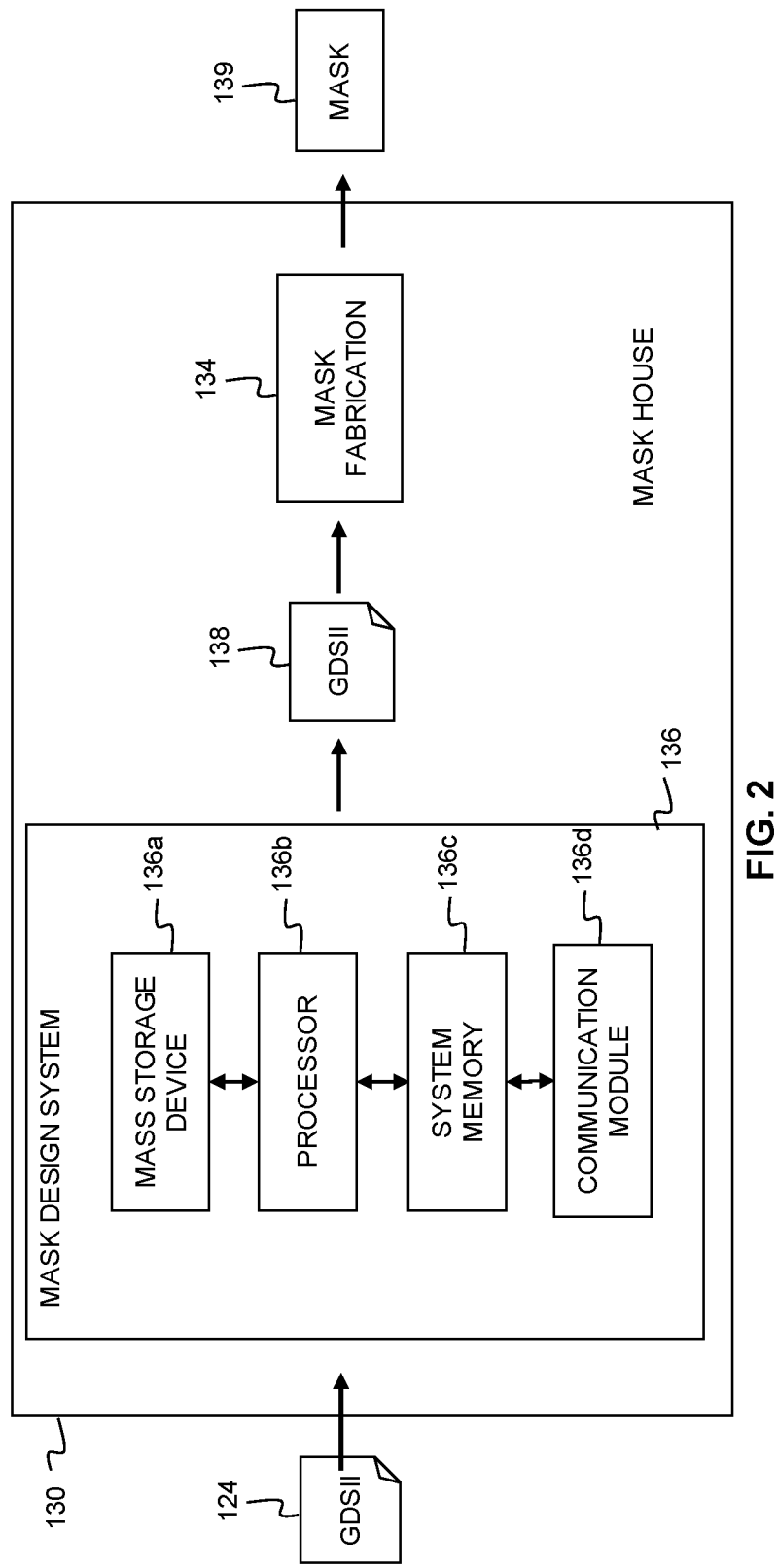
FIG. 2 is a more detailed block diagram of the mask house shown in FIG. 1 according to various aspects of the present disclosure.

FIG. 2 is a more detailed block diagram of the mask house 130 shown in FIG. 1 according to various aspects of the present disclosure. In the illustrated embodiment, the mask house 130 includes a mask design system 136 that is tailored to perform the functionality described in association with mask data preparation 132 of FIG. 1. The mask design system 136 is an information handling system such as a computer, server, workstation, or other suitable device. The mask design system 136 includes a processor 136*b* that is communicatively coupled to a system memory 136*c*, a mass storage device 136*a*, and a communication module 136*d*. The system memory 136*c* provides the processor 136*b* with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 136*a*. Examples of mass storage devices may include hard drives, optical drives, magneto-optical drives, solid-state storage devices, and/or a variety of other mass storage devices known in the art. The communication module 136*d* is operable to communicate information such as IC design layout files with the other components in the IC manufacturing system 100, such as the design house 120. Examples of communication modules may include Ethernet cards, 802.11 WiFi devices, cellular data radios, and/or other suitable devices.

In operation, the mask design system 136 is configured to manipulate the IC design layout 122 before it is transferred to a mask 139 by the mask fabrication 134. In an embodiment, the mask data preparation 132 in FIG. 1 is implemented as software instructions executing on the mask design system 136 in FIG. 2. To further this embodiment, the mask design system 136 receives a first GDSII file 124 containing the IC design layout 122 from the design house 120, and modifies the IC design layout 122, for example, to extend the device patterns, to insert dummy patterns, to move portions of the dummy patterns, to adjust the lengths of the dummy patterns, to connect portions of the dummy patterns, and to perform other manufacturability enhancement. After the mask data preparation 132 is complete, the mask design system 136 transmits a second GDSII file 138 containing a modified IC design layout to the mask fabrication 134. In alternative embodiments, the IC design layouts 122 and 138 may be transmitted between the components in IC manufacturing system 100 in alternative file formats such as DFII, CIF, OASIS, or any other suitable file type. Further, the mask design system 136 and the mask house 130 may include additional and/or different components in alternative embodiments.

Figure 3:
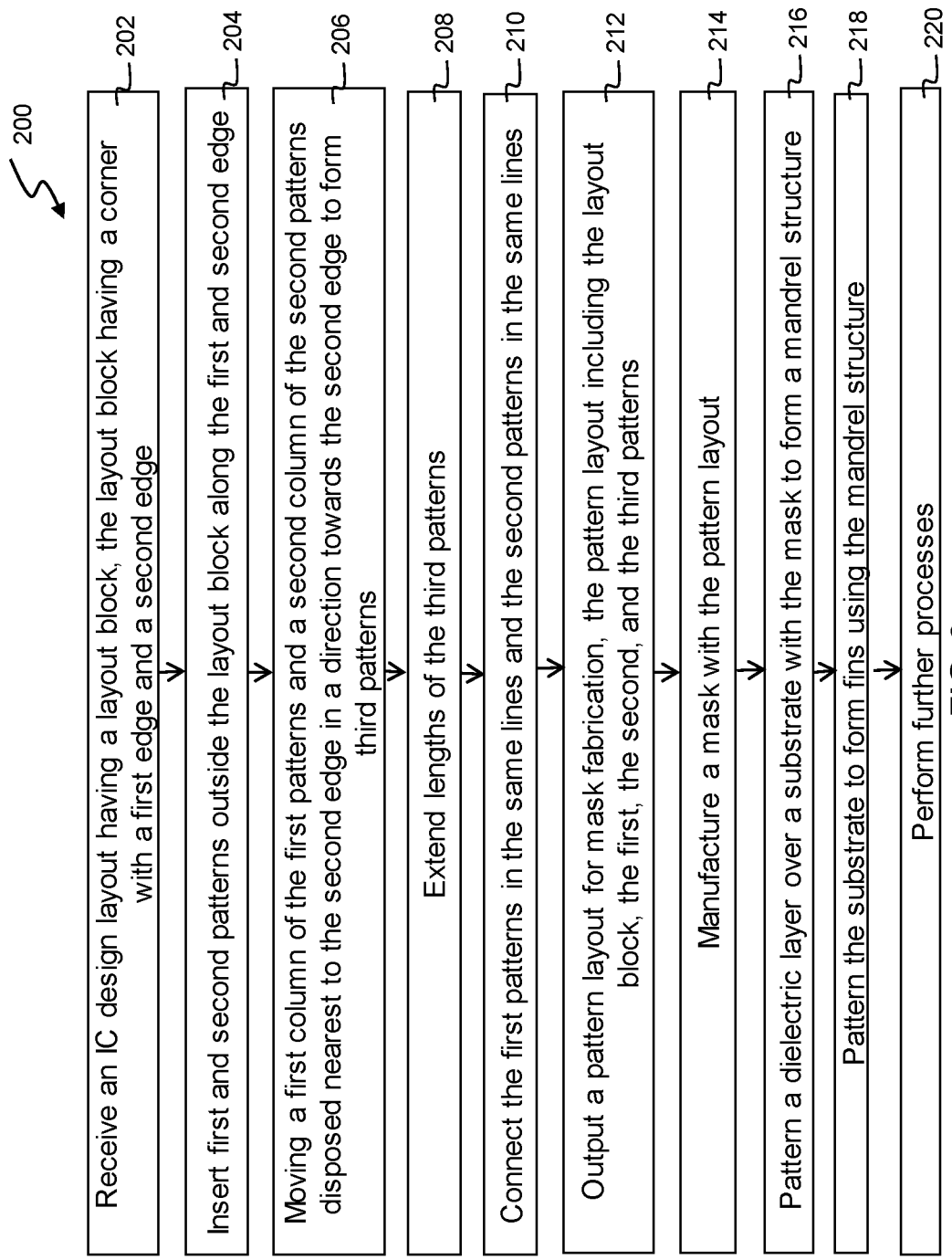
FIG. 3 shows a flowchart of a method of manufacturing an IC according to various aspects of the present disclosure.

FIG. 3 is a high-level flowchart of a method 200 of manufacturing the IC 150 according to various aspects of the present disclosure. In a brief overview, the method 200 includes operations 202, 204, 206, 208, 210, 212, 214, 216, 218, and 220. The operation 202 receives an IC design layout having multiple layout blocks distributed across the IC design layout according to design requirements. The operation 204 modifies the IC design layout by inserting patterns 400 and 402 (e.g., line patterns) outside the layout blocks 302, 304, 306, 308, 310, 312, and 314 (see FIGS. 5 and 6). The method 200 then change the positions of a column 401 of the first patterns and a column 403 of the second patterns in the operation 206 (see FIG. 7), the repositioned first patterns and second patterns are collectively referred to as the third patterns. The operation 208 extends the lengths of the third patterns. The operation 210 connects the first patterns in same lines and the second patterns in same lines. The operation 212 outputs a pattern layout for mask fabrication. The operation 214 fabricates a mask with the pattern layout. The operation 216 patterns the IC substrate with the mask to form a mandrel structure. The operation 218 forms a fin structure using the mandrel structure. The fin structure may be formed using the mandrel structure as a mask directly, or using spacers formed on sidewalls of the mandrel structure. Thereafter, the operation 220 performs additional processes necessary to form the IC 150.

The method 200 may be implemented in the various components of the IC manufacturing system 100. For example, the operations 202, 204, 206, 208, 210 and 212 may be implemented in the mask data preparation 132 of the mask house 130; the operation 214 may be implemented in the mask fabrication 134 of the mask house 130; and the operations 216, 218, and 220 may be implemented in the IC manufacturer 140. The method 200 is merely an example for illustrating various aspects of the provided subject matter. Additional operations can be provided before, during, and after the method 200, and some operations described can be replaced, eliminated, or moved around for additional embodiments of the method 200. The method 200 in FIG. 3 is a high-level overview and details associated with each operation therein will be described in association with the subsequent figures in the present disclosure.

At operation 202, referring to FIGS. 3 and 4, the method 200 receives the IC design layout 122. The IC design layout 122 includes various geometrical patterns (e.g., patterns corresponding to devices) for creating features of an IC. In the present embodiment, these geometrical patterns are confined in layout blocks, for example, layout blocks 302, 304, 306, 308, 310, 312, and 314. The layout blocks may be any user defined shapes such as square, rectangle, oval, circle, and/or other regular or irregular shapes. The layout blocks may be uniform in size and evenly distributed across the substrate or may be of different sizes and distributed across the IC design layout 122 irregularly according to design requirements. In the present embodiments, the layout blocks 302, 304, 306, 308, 310, 312, and 314 are rectangles of different sizes.

In the present embodiments, the IC design layout 122 includes the layout blocks 302, 304, 306, 308, 310, 312, and 314 that are distributed (or disposed, placed) in the IC design layout 122 by design requirements. For example, the layout blocks 310, 312, and 314 are disposed apart from other layout blocks without sharing edges (or common edges, common borders). In an alternative example, the layout blocks 306 and 308 of the same shape and size are disposed adjacent to each other with a shared edge in a symmetric manner. In another example, the layout blocks 320 and 304 of the same shape but different size are positioned together with a common edge MN. A corner α of the larger layout block 302 protrudes away from the smaller layout block 304 along the common edge MN. The edge MO, a portion MQ of the edge MN, and an edge QP form a Z shape OMQP. In the present embodiments, the Z shape OMQP is a right-angle Z shape. The layout blocks 320 and 340 each include a plurality of device patterns 302', 304', 306', 308', 310', 312', and 314' respectively, designed according to restrictive design rules (RDR). An example IC layout according to RDR includes parallel line patterns extending in the same direction and spaced by a line pitch where the line width and line pitch are designed so as to improve image printing quality by utilizing constructive light interference. In the present embodiments, the device patterns 302', 304', 306', 308', 310', 312', and 314' are line patterns oriented lengthwise along the X direction.

In some design, dummy patterns are disposed outside the layout blocks to adjust the pattern density. Well-controlled pattern density throughout the IC improve product quality and reduce processing complexity. For example, adequate pattern density prevents or reduces dishing effect during chemical mechanical planarization (CMP) in fabrication processes, thereby achieving better topography after CMP. In another example, suitable pattern density and device density improve etching uniformity during etching processes.

To adjust pattern density across the IC, dummy patterns are inserted outside the layout blocks and are designed to have the same or very similar densities as the patterns (which may include device patterns and/or dummy patterns) inside the layout blocks. In general, space outside the layout blocks is divided into multiple regions (e.g., rectangular regions) such that the dummy patterns in each region have uniform sizes, line pitches, and column distances. Such design provides balances between pattern density and process complexity. However, due to the irregular distribution and non-uniform sizes of the layout blocks, dummy patterns may not be properly inserted and/or distributed in the areas near the corner and/or edge of the layout blocks, leaving empty space between the regions of dummy patterns and affecting the pattern density and device density. Embodiments of the present disclosure provides methods of improving the pattern density by inserting dummy patterns in the empty space near the corners and edges of the layout blocks. For example, by moving and elongating dummy patterns next to the corners and edges of the layout blocks to reduce the empty space.

Figure 5:
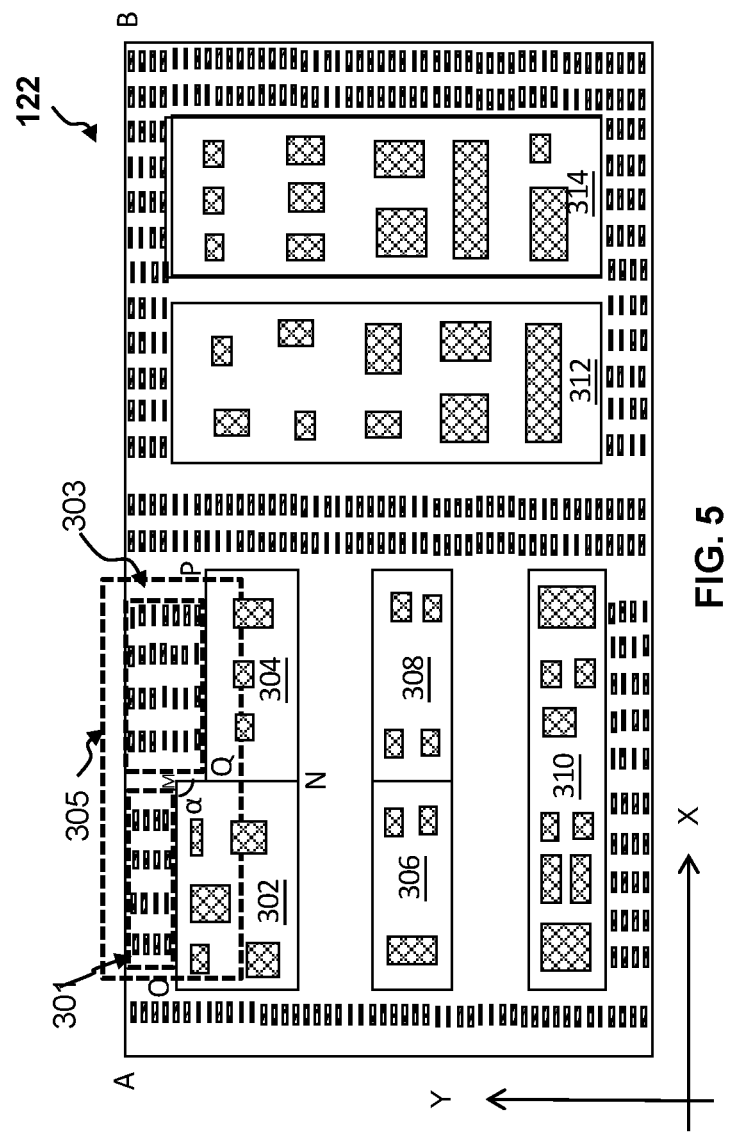
FIGS. 5, 6, 7, 8, 9, and 10 illustrate modified IC design layouts according to the method shown in FIG. 3, according to various aspects of the present disclosure.
Figure 6:
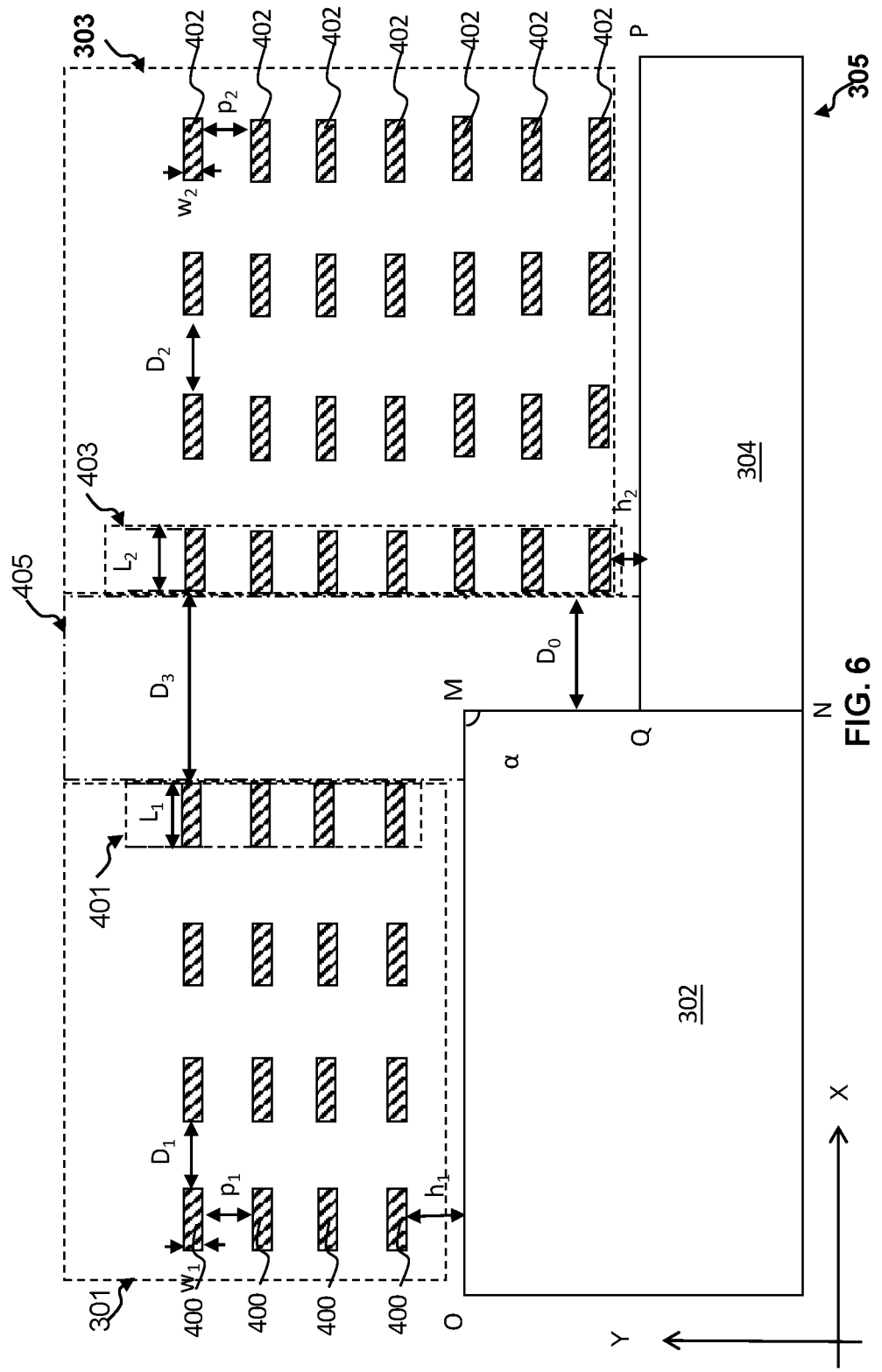

At operation 204, referring to FIGS. 3, 5, and 6, the method 200 inserts dummy patterns in the space in the IC design layout 122 outside the layout blocks 302, 304, 306, 308, 310, 312, and 314. The space is divided into multiple regions according to the distribution of the layout blocks 302, 304, 306, 308, 310, 312, and 314. Each region is a user defined shape. In the present embodiments, the user defined shape is rectangles or squares for easier processing. The regions are positioned along each of the edges of the layout blocks 302, 304, 306, 308, 310, 312, and 314. Further, one region extends along one edge of the layout blocks 302, 304, 306, 308, 310, 312, and 314. Device patterns 302', 304', 306', 308', 310', 312', and 314' are omitted from FIGS. 6-10 for simplicity.

The multiple regions may include arrays of dummy patterns of same or different sizes and shapes. For example, region 301 includes an array of patterns 400 next to an edge OM of the layout block 302, and region 303 includes an array of patterns 402 next to the edge MN of the layout block 302 and the edge QP of the layout block 304. The region 301 is the only region next to the edge OM. Similarly, the region 303 is the only region next to the edges MQ and QP. In some embodiments, the line pitches and the column distances of different arrays of dummy patterns may differ. In the present embodiments, the line pitches, column distances, pattern line width, and pattern line length are the same in different regions. For example, as shown in FIG. 6, the line pitch $P_1$, column distance $D_1$, pattern line width $w_1$, and pattern line length $L_1$ of the regions 301 are the same as the line pitch $P_2$, column distance $D_2$, pattern line width $w_2$, and pattern line length $L_2$ of the layout block 302, respectively.

A height $h_1$ from the edge OM to a bottommost line of patterns 400 in the region 301 is less than a sum of the width $w_1$ and pitch $p_1$. The height $h_1$ can be less than the sum of the width $w_1$ and pitch $p_1$ because the way region 301 is designed and positioned. For example, the region 301 is a rectangular shaped and is the only region disposed above the edge OM along the entire length of the edge OM. In the case where height $h_1$ is greater than the sum of the width $w_1$ and pitch $p_1$, an additional line of the patterns 400 is inserted between the region 301 and the edge OM. Similarly, the height $h_2$ from the bottommost patterns 402 to the edge QP of the layout block 304 is less than a sum of the width $w_2$ and pitch $p_2$.

An irregular (or non-rectangular) space 405 is disposed between the region 301 and the region 303. The irregular space 405 has a width $D_3$ at a top portion and a width $D_0$ at a bottom portion. The width $D_3$ is defined from the rightmost column 401 in the region 301 to the leftmost column 403 in the region 303, where $D_3$ is less than a sum of the length $L_1$ and two times of the distance $D_1$ in the present embodiments. An additional column may be inserted to the region 301 and/or the region 303 in the case where $D_3$ is greater than a sum of the length $L_1$ and two times of the distance $D_1$. The distance $D_0$ is defined from the column 403 to the common edge MN. The distance $D_0$ is less than the distance $D_3$. The irregular space 405 is also defined by a corner $\alpha$ of the layout block 320, edges OM and MQ of the corner $\alpha$, and an edge QP of the layout block 304. The edges OM, MQ, and QP forms a Z shape OMQP with a corner $\alpha$. In the present embodiments, the corner $\alpha$ is a 90° angle, i.e., the Z shape OMQP is a right-angle Z shape OMQP.

Figure 7:
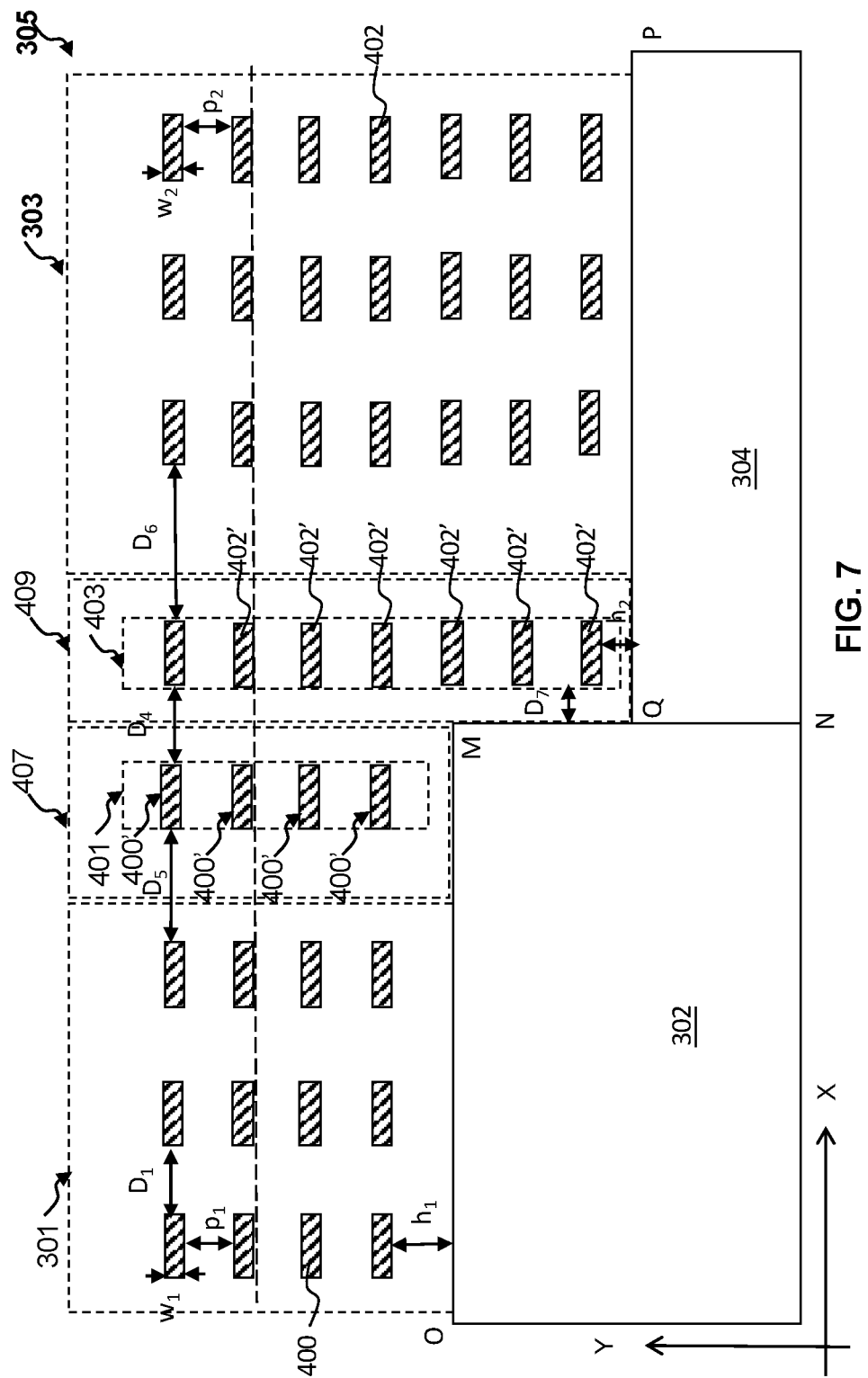

At operation 206, referring to FIGS. 3 and 7, the method 200 moves a portion of the patterns 400 from the region 301 and a portion of the patterns 402 from the region 303 toward the common edge MN. For example, a rightmost column 401 of the patterns 400 (the column closest or nearest to the common edge MN) is moved laterally to the right toward the common edge MN, while a leftmost column 403 of the patterns 402 is moved laterally to the left toward the common edge MN. The patterns in column 401 are hereafter denoted as 400' and the patterns in the column 403 are hereafter denoted as 402'. A region 407 including the patterns 400' and a region 409 including the patterns 402' partially overlap with the irregular space 405. In the present embodiments, patterns 400' go through the same operation in subsequent processes, such as elongation. Similarly, patterns 402' in the region 409 go through the same operation in subsequent processes, such as elongation. In the present embodiments, the region 407 and 409 are rectangles of different sizes. For example, the region 409 is longer than the region 407 lengthwise.

Still referring to FIG. 7, the moving of the columns 401 and 403 fills the irregular space 405 around the corner $\alpha$ of the layout block 302 with dummy patterns, which is simpler than inserting dummy patterns into the irregular space 405. After the moving, the column 401 and the column 403 are still located at opposite sides of the common edge MN. In other words, the moving of the column 401 or the column 403 is confined on one side of the common edge MN and does not cross the common edge MN. An extension line of the common edge MN does not penetrate into patterns 400' or 402'.

A distance $D_4$ between the column 401 and the column 403 may be any user defined value for improving pattern density. In the present embodiments, the distance $D_4$ is designed to be the same as the distance $D_1$ to simplify the subsequent operations, such as adding connecting patterns 412 to connect dummy patterns in the same line as shown in FIG. 10 explained in detail below. With $D_4$ being the same as $D_1$, the connecting patterns 412 and the connecting patterns 408 and 410 (see FIG. 9) can have the same length, which simplifies the process than in the case where the distance $D_4$ is different from the distance $D_1$.

In one embodiment, $D_3$ is less than a sum of the length $L_1$ and the distance $D_1$, and the distance $D_4$ equals to the distance $D_1$, such that a sum of a moving distance $D_m$ of column 401 and a moving distance $D_m'$ of column 403 is less than a sum of the width $w_1$ and the distance $D_1$. In some embodiments, the distance $D_m$ is different from the distance $D_m'$. In the present embodiments, the distance $D_m$ is the same as the distance $D_m'$ for process simplification. In this case, a distance $D_5$ between the patterns 402' and the nearest patterns 402 in the same line is less than a sum of 0.5 times $L_1$ and 1.5 times $D_1$ after the moving of the column 401 and the column 403. A distance $D_7$ between the column 403 after the moving is less than the distance $D_0$ before the moving as shown in FIG. 6.

Figure 8:
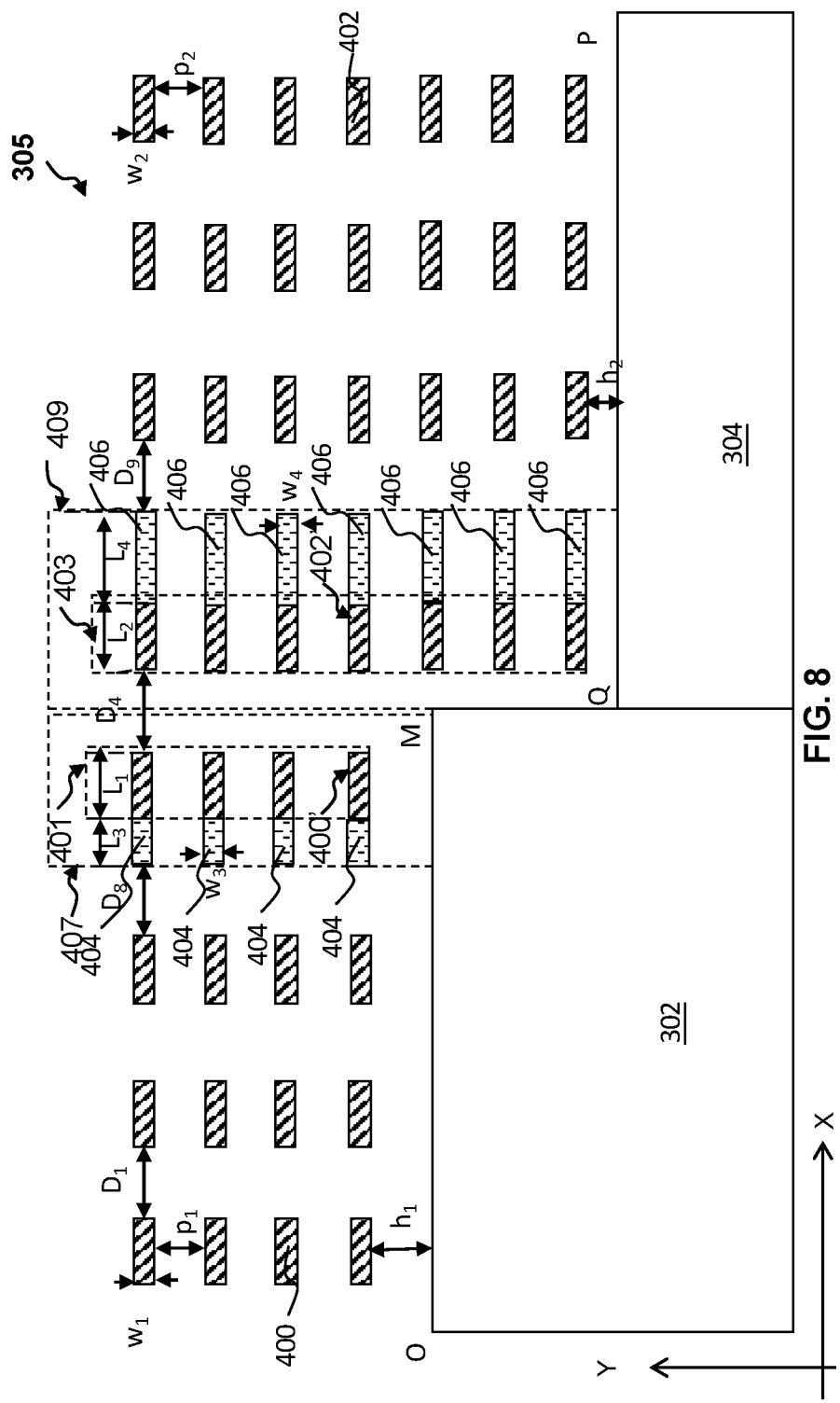

At operation 208, referring to FIGS. 3 and 8, the method 200 extends the lengths of the patterns 400' and 402' in the columns 401 and 403 respectively. More specifically, patterns 404 are formed connecting to the patterns 400' at the left side thereof (i.e., the side further away from the common edges MN) in the region 407 to elongate the patterns 400'. Patterns 406 are formed connecting to the patterns 402' at the right side thereof (i.e., the side further away from the common edges MN) in the region 409 to elongate the patterns 402'. As stated above, the region 407 and the region 409 are rectangles due to the moving of the columns 401 and 403 towards the common edge MN. Without the moving of the columns 401 and 403, the patterns 404 and 406 need to be added in the irregular space 405, which is more complex than adding patterns 404 and 406 into rectangular shaped regions 407 and 409.

The length $L_3$ of the patterns 404 and the length $L_4$ of the patterns 406 may be any user defined value to achieve design requirements. For example, $L_3$ may be different from (i.e., greater than or less than) $L_4$. In the present embodiments, the length $L_3$ equals to the length $L_4$ for process simplicity. A distance $D_8$ between the patterns 404 and the patterns 400 and a distance $D_9$ between the patterns 406 and the patterns 402 are related to the lengths $L_3$ and $L_4$. In the present embodiments, the $D_8$ and $D_9$ are designed to be the same as the distance $D_1$, the lengths $L_3$ and $L_4$ are designed such that the distances $D_8$ and $D_9$ are designed to be the same as the distance $D_1$. In an example where the distance $D_5$ is less than a sum of 0.5 times $L_1$ and 1.5 times $D_1$ as explained above (FIG. 7), a length $L_3$ is less than a sum of 0.5 times $L_1$ and 0.5 times $D_1$. In the present embodiments, a width $w_3$ of each pattern 404 and a width $w_4$ of each pattern 406 are the same as the width $w_1$.

Figure 9:
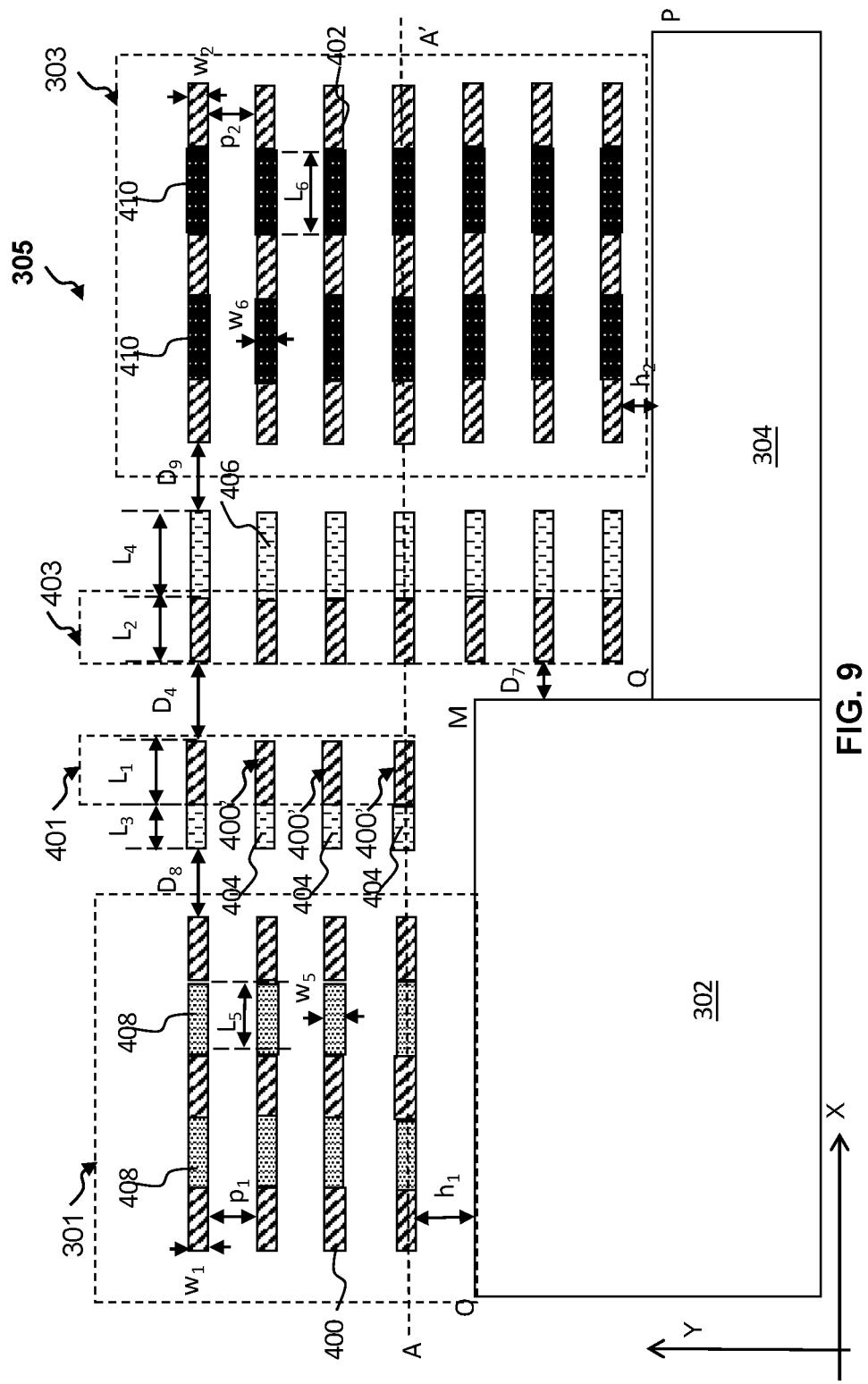
Figure 10:
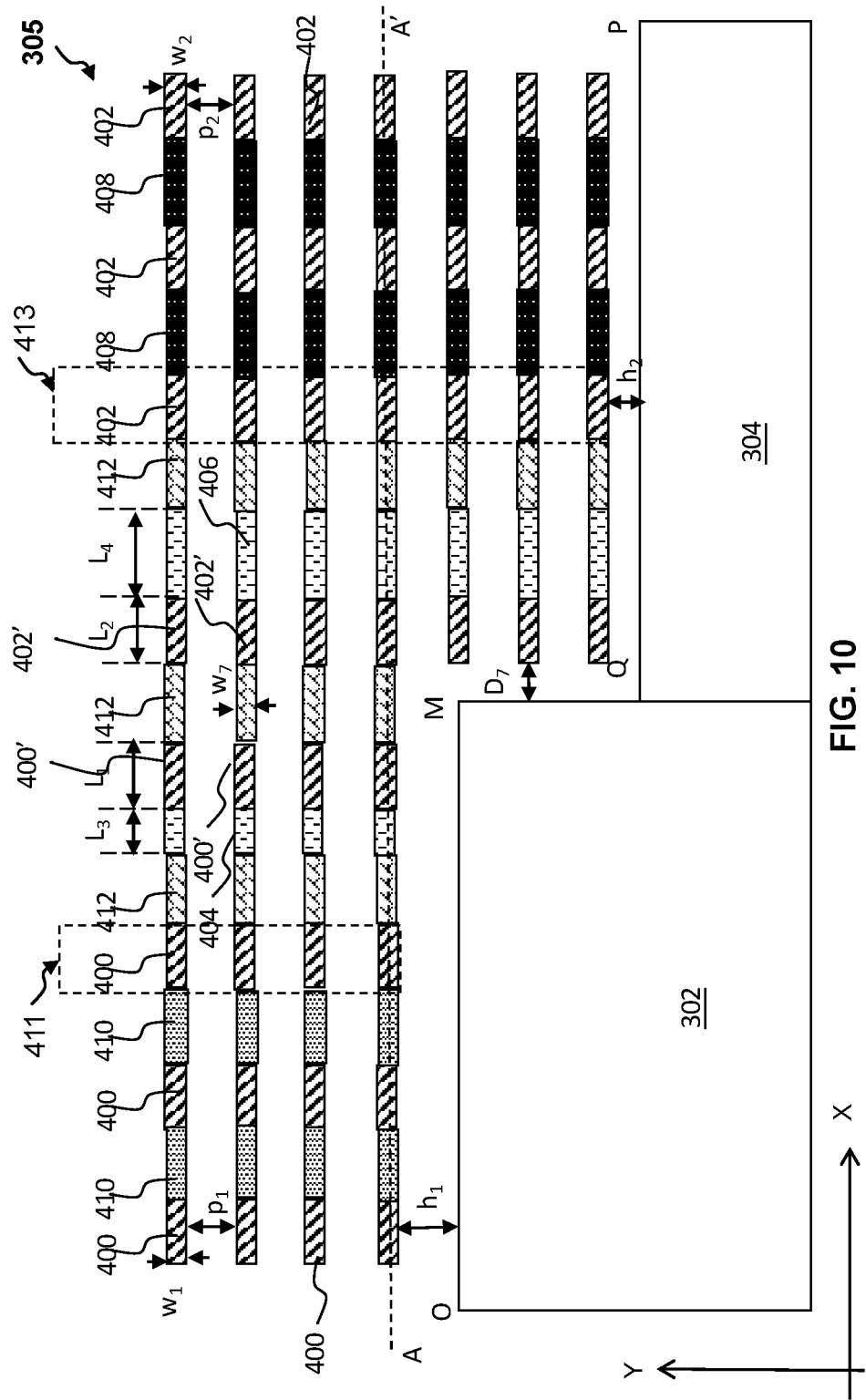

At operation 210, referring to FIGS. 3 and 9, the method 200 connects the patterns 400 in the same lines by inserting patterns 408. The patterns 408 have a width $w_5$ that is the same as the width $w_1$ and a length $L_5$ that is the same as the distance $D_1$. Similarly, the method 200 connects the patterns 402 in the same lines by inserting patterns 410. The patterns 410 have a width $w_6$ that is the same as the width $w_2$ and a length $L_6$ that is the same as the distance $D_2$. The patterns 408 and 410 are inserted to further increase the pattern density. Further, longer patterns are generally more photolithography-friendly than shorter patterns. The columns 401 and 403 as well as the patterns 404 and 406 are excluded from connecting to patterns 400 and 402 to keep the patterns in the regions 301 and 303 uniform, e.g., in sizes, line pitches, and column widths.

Referring to FIG. 10, the method 200 further connects the patterns 404 with the nearest patterns 400 in a column 411 by inserting patterns 412. Similarly, the method connects the patterns 400' with the patterns 402' by inserting patterns 412. Additionally, the method 200 connects the patterns 406 with the nearest patterns 402 in a column 413 by inserting patterns 412. In the present embodiment, a width $w_7$ of each pattern 412 is the same as the width $w_1$. The inserting of the patterns 412 forms connected line patterns including the patterns 400, 400', 402, 402', 404, 406, 408, 410, and 412 in the same lines if the connected line patterns is above the edge OM. The connected line patterns may include patterns 402, 402', 406, 408, and 412 but not including the patterns 400, 400', 404, and 410 if the connected line pattern is below the edge OM and above the edge QP. The extended patterns span across the space outside the layout blocks 302 and 304.

At operation 212, referring back to FIGS. 2 and 3, the method 200 outputs a pattern layout for mask fabrication. In the present embodiment, the pattern layout includes the layout blocks 302, 304, 306, 308, 310, 312, and 314 and the device patterns disposed therein and the dummy patterns outside the layout blocks including the extended line patterns as explained in detail above. The pattern layout or a derivative thereof is used to pattern the substrate to form structures on or in the substrate. Further, the pattern layout may also include certain assist features, such as those features for imaging effect, processing enhancement, and/or mask identification information. In some embodiments, operation 212 outputs the pattern layout in a computer-readable format for subsequent fabrication stage. For example, the layout may be outputted in GDSII, DFII, CIF, OASIS, or any other suitable file format.

At operation 214, the method 200 manufactures a mask with the pattern layout. In some embodiments, the mask may be a transmissive mask (e.g., for deep ultraviolet lithography) or a reflective mask (e.g., for extreme ultraviolet lithography), and may include imaging enhancement features such as phase shifting. In embodiments where mask-less lithography, such as e-beam direct writing, is used, operation 214 is bypassed or involves data preparation for the particular direct writer without fabricating an actual mask. In the present embodiments, the mask carries the pattern layout including the layout blocks 302, 304, 306, 308, 310, 312, and 314 and the device patterns disposed therein and the dummy patterns outside the layout blocks including the extended line patterns.

Figure 11:
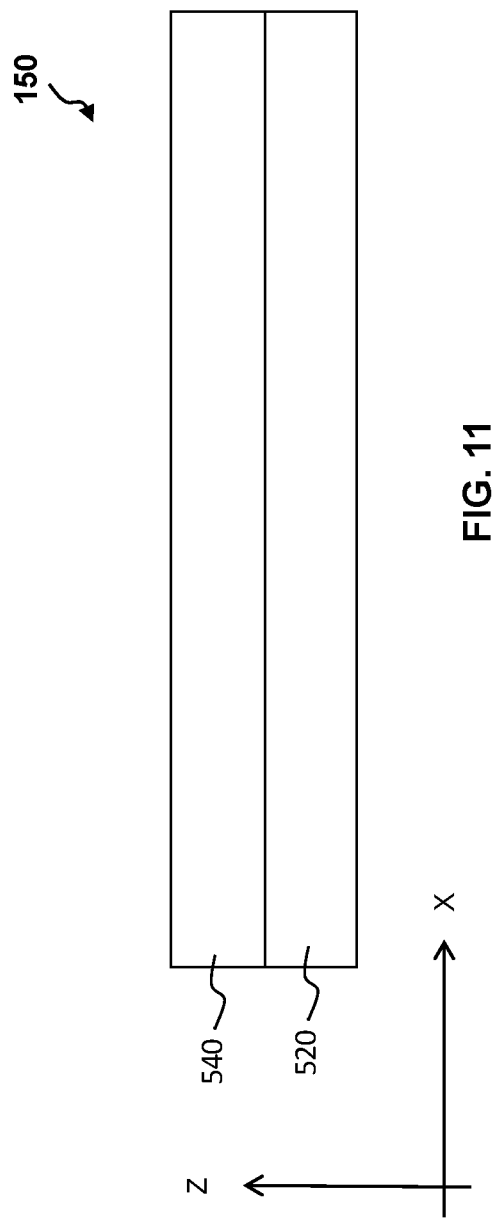
FIGS. 11, 12, and 13 illustrate cross-sectional view of an IC in various manufacturing steps of the method shown in FIG. 3, according to various aspects of the present disclosure.
Figure 12:
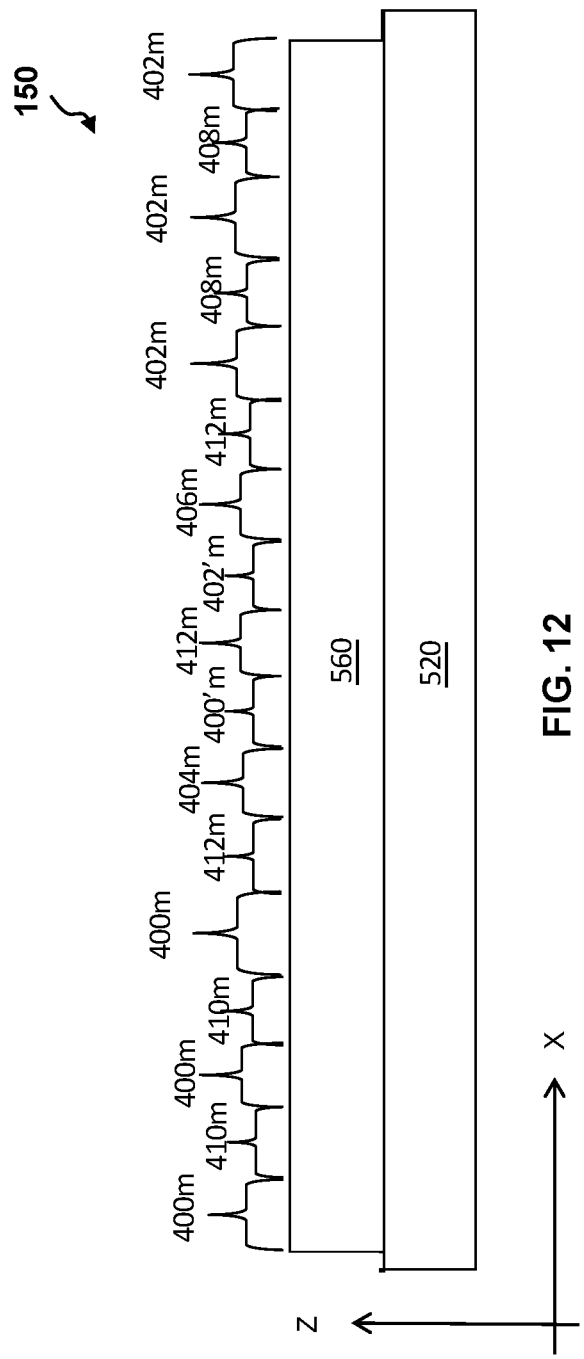

At operation 216, referring to FIGS. 3, 11, and 12, the method 200 patterns a substrate 520 (such as a wafer) with the mask to fabricate a structure 560. In various embodiments, the substrate 520 may include one or more elementary semiconductor, such as germanium; a compound semiconductor, such as silicon carbide, indium arsenide, or indium phosphide; or an alloy semiconductor, such as silicon germanium carbide, gallium arsenic phosphide, or gallium indium phosphide. The substrate 520 includes silicon in the present embodiment. Prior to patterning the substrate 520, referring to FIG. 11, a dielectric layer 540 is deposited over the substrate 520. Materials suitable for the dielectric layer 540 include, but not limited to, silicon oxide, silicon nitride, poly-silicon, $Si_3N_4$, SiON, TEOS formed oxide, nitrogen-containing oxide, nitride oxide, high-k materials, or combinations thereof. The dielectric layer 540 may include multiple layers and may be formed by one or more deposition techniques, such as thermal oxidation, chemical vapor deposition (CVD), and physical vapor deposition (PVD).

Referring to FIG. 12, the method 200 then patterns the dielectric layer 540 to form a mandrel structure 560 over the substrate 520 using the first mask. The mandrel structure 560 carries the pattern layout including mandrel lines 400m, 400'm, 402m, 402'm, 404m, 406m, 408m, 410m, and 412m, corresponding to the connected patterns 400, 400', 402, 402', 404, 406, 408, 410, and 412 outside the layout blocks.

The mandrel structure 560 is formed by patterning the dielectric layer 540 with a procedure including a lithography process and an etching process. For example, a photoresist (or resist) layer (not shown) is formed on the dielectric layer 540 using a spin-coating process and soft baking process. Then, the photoresist layer is exposed to a radiation using the mask manufactured in the operation 214. The exposed photoresist layer is developed using post-exposure baking, developing, and hard baking thereby forming a patterned photoresist layer over the dielectric layer 540. Subsequently, the dielectric layer 540 is etched through the openings of the patterned photoresist layer, forming the mandrel structure 560. The etching process may include a dry (or plasma) etching, a wet etching, or other suitable etching methods. The patterned photoresist layer is removed thereafter using a suitable process, such as wet stripping or plasma ashing. During the above photolithography process, the density and uniformity of the mandrel structure 560, including device mandrel lines inside the layout blocks and the dummy mandrel lines outside the layout blocks, help improve pattern critical dimension uniformity in view of optical proximity effect.

In some embodiments, the mandrel structure 560 is used directly as a mask to fabricate components (such as fins) on the substrate. Alternatively, derivatives of the mandrel structure 560, such as spacers, may be formed and then used to fabricate components (such as fins) on the substrate. For example, the spacers may be formed on sidewalls of the mandrel structure 560 and completely surrounds the mandrel structure 560. In an embodiment, the spacers have a substantially uniform thickness. The spacers include one or more materials different from the mandrel structure 560. In an embodiment, the spacers may include a dielectric material, such as titanium nitride, silicon nitride, or titanium oxide. The spacers can be formed by various processes, including a deposition process and an etching process. For example, the deposition process may include a CVD process or a PVD process. For example, the etching process may include an anisotropic etch such as plasma etch. In the embodiment depicted in FIGS. 12 and 13, the forming of the spacers is bypassed and the mandrel structure 506 is used for etching the substrate without forming the spacers.

Figure 13:
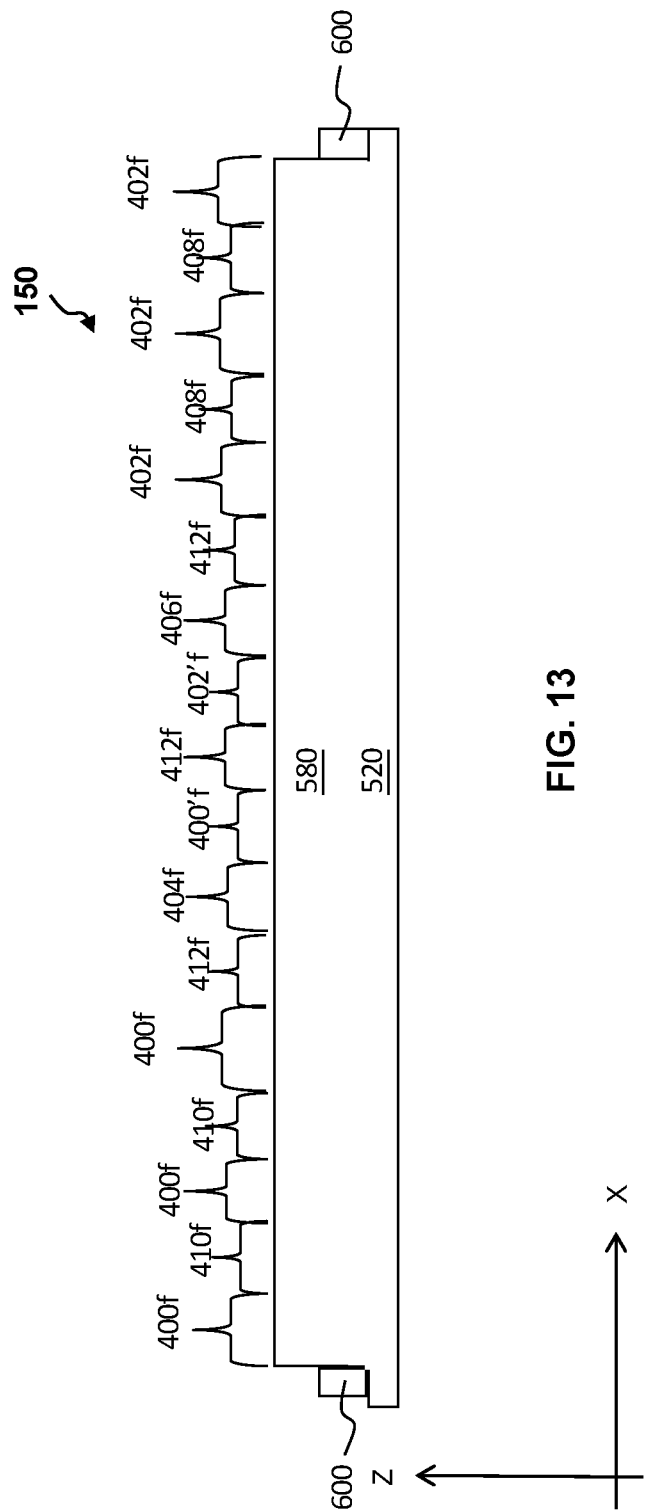

At operation 218, referring to FIGS. 3 and 13, the method 200 etches the substrate 520 to form a fin structure 580 using the mandrel structure 560 as an etch mask. The fin structure 580 carries the same patterns as the mandrel structure 560, including device fins corresponding to the device mandrel lines in the mandrel structure and dummy fins 400*f*, 400'*f*, 402*f*, 402'*f*, 404*f*, 406*f*, 408*f*, 410*f*, and 412*f* corresponding to the dummy mandrel lines 400*m*, 400'*m*, 402*m*, 402'*m*, 404*m*, 406*m*, 408*m*, 410*m*, and 412*m* in the mandrel structure 560. In other words, the mask, the mandrel structure 560, and the fin structure 580 have the same pattern. The etching process can be a wet etching, a dry etching, or a combination thereof. The mandrel structure 560 is subsequently removed.

At operation 220, the method 200 performs further processes to complete the fabrication of the final IC 150. For example, the operation 220 may form isolation structure 600 as shown in FIG. 13. The isolation structure 600 electrically isolates the various fins, including the device fins and the dummy fins. In an embodiment, operation 220 forms the isolation structure 600 by depositing a dielectric material such as silicon oxide over the substrate 520 and then etches back the dielectric material. In the present embodiment, portions of the device fins protruding above the isolation structure 600 provide source, drain, and channel regions for FinFETs. The dummy fins undergo the same processes as the device fins to achieve better device density and process uniformity.

The operation 220 may also form gate stacks (not shown) over the device fins and dummy fins using a gate-first process or a gate-last process. Thereafter, the operation 220 may form source and drain regions (not shown) in the fins using ion implantation, epitaxial growth, and/or other suitable methods. Other processes include forming source and drain contacts, forming gate contacts, and forming via and metal interconnects, and so on.

Although not intended to be limiting, the present disclosure provides many benefits to the manufacturing of an IC. For example, the present disclosure includes a method of forming dummy patterns outside layout blocks to increase the pattern density. Specifically, space around corners and/or edges of the layout blocks are filled with dummy patterns by moving nearby columns of patterns from adjacent regions, extending the lengths of the moved patterns along a direction opposite to the moving direction, and connecting the patterns in same lines. The present embodiments improve pattern density and device density to improve IC processes, such as reducing dishing effect during CMP and increasing etching uniformity.

In one aspect, the present disclosure provides a method that includes receiving an integrated circuit (IC) design layout including a layout block, where the layout block has a corner, adding first patterns along a first edge of the corner, adding second patterns along a second edge of the corner, moving a first column of the first patterns closest to the second edge horizontally toward the second edge, moving a second column of second patterns closest to the second edge horizontally toward the second edge, extending lengths of the first and second patterns in the first and second columns, and outputting a pattern layout in a computer-readable format, where the pattern layout includes the first patterns and the second patterns.

In another aspect, the present disclosure provides a method of forming a pattern layout for semiconductor fabrication that includes providing an integrated circuit (IC) design layout including a first layout block and a second layout block sharing a common edge with the first layout block, where a first edge of the first layout block connected to the common edge is parallel to a second edge of the second layout block connected to the common edge, adding first patterns over the first edge, adding second patterns over the second edge, moving a first column of the first patterns nearest to the common edge laterally toward the common edge, moving a second column of the second patterns nearest to the common edge laterally toward the common edge, adding third patterns contacting each of the first patterns in the first column extending away from the common edge, adding fourth patterns contacting each of the second patterns in the second column extending away from the common edge, and outputting a pattern layout in a computer-readable format, where the pattern layout includes the first, the second, the third, and the fourth patterns.

In yet another aspect, the present disclosure provides a pattern layout for semiconductor fabrication that includes a layout block having a border. The border includes a first edge, a second edge parallel to the first edge, and a third edge perpendicular to and connecting the first and the second edges, where the first edge and the second edge are disposed on opposite sides of the third edge. The pattern layout further includes a first column of first patterns disposed over and parallel to the first edge, a second column of second patterns disposed over and parallel to the second edge, and third patterns between the first patterns and the second patterns. The third patterns are disposed in a third column and a fourth column, where the fourth column includes more patterns than the third column.

The foregoing outlines features of several embodiments so that those having ordinary skill in the art may better understand the aspects of the present disclosure. Those having ordinary skill in the art should appreciate that they may readily use the present disclosure as a basis for designing or modifying other processes and structures for carrying out the same purposes and/or achieving the same advantages of the embodiments introduced herein. Those having ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving an integrated circuit (IC) design layout including a layout block, wherein the layout block has a corner;
adding first patterns along a first edge of the corner;
adding second patterns along a second edge of the corner;
moving a first column of the first patterns closest to the second edge toward the second edge;
moving a second column of second patterns closest to the second edge toward the second edge;
extending lengths of the first and second patterns in the first and second columns; and
outputting a pattern layout in a computer-readable format, wherein the pattern layout includes the first and the second patterns.

2. The method of claim 1, wherein the extending of the lengths of the first and the second patterns in the first and the second columns extends the lengths in directions away from the second edge.

3. The method of claim 1, wherein the first patterns and the second patterns are line patterns parallel to the first edge, and wherein the second edge is perpendicular to the first edge.

4. The method of claim 1, further comprising
connecting the first patterns in same lines together except the first column; and
connecting the second patterns in same lines together except the second column.

5. The method of claim 1, wherein the first patterns and the second patterns are dummy patterns disposed outside the layout block, wherein dummy devices are formed from the first and the second patterns or derivatives of the first and the second patterns.

6. The method of claim 1, wherein the first patterns and the second patterns have the same line width and line pitch.

7. The method of claim 1, wherein the first column is moved by a distance that is less than a sum of a length of each first patterns and a distance between nearest columns of the first patterns.

8. The method of claim 1, wherein a sum of an extended length of each first patterns in the first column and an extended length of each second column is a first number, wherein a sum of a length of each first patterns in the first column and a distance between nearest columns of the first patterns is a second number, and wherein the first number is less than the second number.

9. A method of forming a pattern layout for semiconductor fabrication, comprising:
providing an integrated circuit (IC) design layout including a first layout block and a second layout block sharing a common edge with the first layout block, wherein a first edge of the first layout block connected to the common edge is parallel to a second edge of the second layout block connected to the common edge, wherein a corner is formed at the common edge;
adding first patterns over the first edge proximate to the corner;
adding second patterns over the second edge proximate to the corner;
moving a first column of the first patterns nearest to the common edge toward the common edge;
moving a second column of the second patterns nearest to the common edge toward the common edge;
extending lengths of the first and second patterns in the first and second columns by adding third patterns contacting each of the first patterns in the first column extending away from the common edge and adding fourth patterns contacting each of the second patterns in the second column extending away from the common edge; and
outputting a pattern layout in a computer-readable format, wherein the pattern layout includes the first, the second, the third, and the fourth patterns.

10. The method of claim 9, wherein the first, the second, the third, and the fourth patterns are line patterns perpendicular to the common edge and have the same line width and the same line pitch.

11. The method of claim 9, further comprising:
adding fifth patterns between the first patterns in same lines except the first column; and
adding sixth patterns between the second patterns in same lines except the second column, wherein the pattern layout includes the first, the second, the third, the fourth, the fifth, and the sixth patterns.

12. The method of claim 11, wherein a width of the fifth and the sixth patterns is the same as a width of the first and the second patterns, respectively.

13. The method of claim 9, wherein a sum of lengths of the third and the fourth patterns are less than a sum of lengths of each first patterns and a distance between first patterns in the same line.

14. The method of claim 9, wherein a distance between the first edge and the first patterns immediately above the first edge is less than a sum of a line width and a line pitch of the first patterns.

15. A method, comprising:
receiving an integrated circuit (IC) design layout including a layout block, wherein the layout block has a corner;
adding first patterns along a first edge of the corner;
adding second patterns along a second edge of the corner;
moving a first column of the first patterns closest to the second edge horizontally toward the second edge;
moving a second column of second patterns closest to the second edge horizontally toward the second edge;
extending lengths of the first and second patterns in the first and second columns; and
outputting a pattern layout in a computer-readable format, wherein the pattern layout includes the first and the second patterns.

16. The method of claim 15 wherein:
the lengths are extended by adding third patterns contacting each of the first patterns in the first column and adding fourth patterns contacting each of the second patterns in the second column.

17. The method of claim 15 wherein a first edge of the first layout block is connected to the common edge and is parallel to a second edge of the second layout block connected to the common edge.

18. The method of claim 15, wherein the extending of the lengths of the first and the second patterns in the first and the second columns extends the lengths in directions away from the second edge.

19. The method of claim 15, wherein the first patterns and the second patterns are line patterns parallel to the first edge, and wherein the second edge is perpendicular to the first edge.

20. The method of claim 15, further comprising
   connecting the first patterns in same lines together except the first column; and
   connecting the second patterns in same lines together except the second column.

* * * * *